Figure 4:
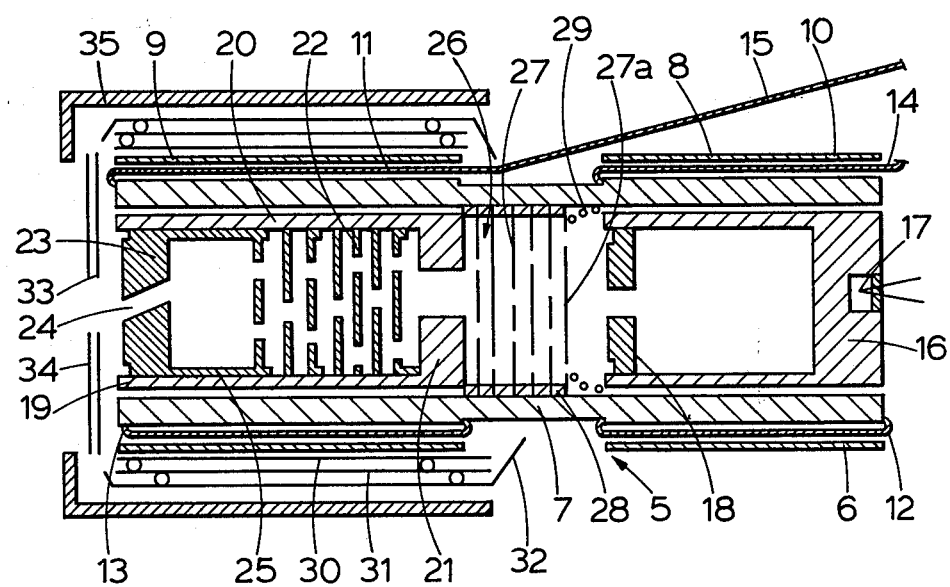

United States Patent [19]

Roberts

[11] 4,383,872
[45] May 17, 1983

[54] METHOD OF GROWING A DOPED III-V ALLOY LAYER BY MOLECULAR BEAM EPITAXY UTILIZING A SUPPLEMENTAL MOLECULAR BEAM OF LEAD

[75] Inventor: John S. Roberts, Horley, England

[73] Assignee: U.S. Philips Corporation, New York, N.Y.

[21] Appl. No.: 216,339

[22] Filed: Dec. 15, 1980

[30] Foreign Application Priority Data

Dec. 19, 1979 [GB] United Kingdom ................ 7943742

[51] Int. Cl.$^3$ .................. H01L 21/203; H01L 21/363
[52] U.S. Cl. .................................... 148/175; 148/174; 156/610; 156/612; 427/85; 427/87; 357/63
[58] Field of Search ................ 148/174, 175; 156/610, 156/612; 427/85, 87; 357/63, 64; 252/62.3 GA

[56] References Cited

U.S. PATENT DOCUMENTS

| 3,514,348 | 5/1970 | Ku | 148/188 |
| 3,941,624 | 3/1976 | Cho | 148/175 |
| 4,024,569 | 5/1977 | Hawrylo et al. | 357/63 X |
| 4,131,904 | 12/1978 | Ladany et al. | 357/63 X |
| 4,159,919 | 7/1979 | McFee et al. | 148/175 |
| 4,218,271 | 8/1980 | Wood | 148/175 |
| 4,233,092 | 11/1980 | Harris et al. | 148/174 X |
| 4,235,651 | 11/1980 | Kamath et al. | 357/63 X |
| 4,273,594 | 6/1981 | Heller et al. | 148/174 X |
| 4,301,323 | 11/1981 | Schink | 148/174 X |

Primary Examiner—R. Dean
Assistant Examiner—W. G. Saba
Attorney, Agent, or Firm—Paul R. Miller

[57] ABSTRACT

In the present invention, an epitaxial layer of a doped III-V alloy is grown on a semiconductor substrate by a molecular beam epitaxy process using a molecular beam of lead together with molecular beams of the constituent elements of the doped III-V alloy. The magnitude of the lead flux is sufficient to form and maintain a presence of from 5 to 20% of a monolayer of lead on the growth surface. The technique is directed particularly to ternary and quaternary III-V compositions.

4 Claims, 4 Drawing Figures

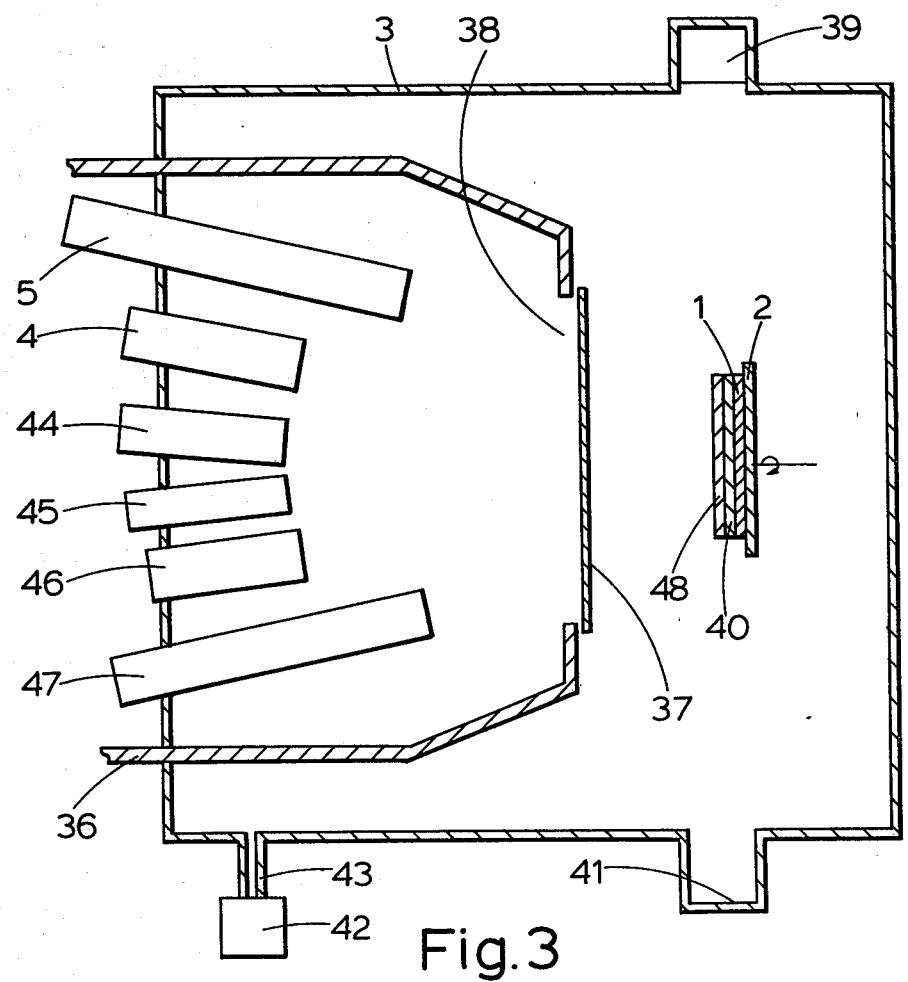

METHOD OF GROWING A DOPED III-V ALLOY LAYER BY MOLECULAR BEAM EPITAXY UTILIZING A SUPPLEMENTAL MOLECULAR BEAM OF LEAD

The invention relates to a method of growing an epitaxial layer of a III-V alloy on a semiconductor substrate by a molecular beam process, and to a semiconductor device comprising a semiconductor substrate bearing an epitaxial layer of a III-V alloy grown by such a method. Throughout this specification, the term "III-V alloy" is understood to signify ternary and quaternary III-V compositions, for example GaInP and GaAlAsP respectively, but to exclude binary III-V compounds.

When growing epitaxial layers of III-V alloys by conventional molecular beam processes, difficulties may be experienced due to the introduction of electron or hole traps which impair the electrical and optical properties of the material. Layers of III-V alloys grown by molecular beam processes are used in making microwave and opto-electronic semiconductor devices such as field effect transistors, and laser diodes.

Layers of III-V alloys which are of high structural quality have been grown by molecular beam epitaxy processes, but considerable difficulty has been experienced in growing high quality p-type doped alloy layers. Beryllium is a p-type dopant which has been used successfully to dope GaAs grown by molecular beam epitaxy processes. It was found necessary in order to grow p-type GaInp doped with beryllium to use a quantity of beryllium which resulted in a beryllium content in the grown layer of at least $3 \times 10^{18}$ atoms/cm³. When using lower dopant concentrations, the grown material was semi-insulating.

An object of the invention is to facilitate the growth of doped III-V alloy, notably p-type III-V alloy layers by a molecular beam epitaxy process.

The invention provides a method of forming an epitaxial layer of a doped III-V alloy on a semiconductor substrate, the method comprising the steps of placing the semiconductor substrate in a vacuum chamber, reducing the pressure in the vacuum chamber to below atmospheric pressure, maintaining the semiconductor substrate at a temperature in the range from 300° C. to 500° C., and forming the epitaxial layer by directing a plurality of molecular beams containing the constituent elements of the doped material constituting the epitaxial layer and a molecular beam of lead onto the heated substrate for a time sufficient to grow an epitaxial layer of a desired thickness, wherein the magnitude of the lead flux is of a value which forms and maintains a presence of from 5 to 20% of a monolayer of lead on the growth surface. The doped III-V alloy may be, for example, beryllium-doped gallium indium phosphide.

The dopants used may be, for example, C, Mg, Ge, Be or Mn (p-type) or Ge, Si, S, Se, Te or Sn (n-type).

The method according to the invention is a modification of conventional molecular beam processes used for growing III-V compound layers, the modification consisting of conducting growth of the layer so that it proceeds through a surface containing a small surface population of ordered lead atoms giving rise to a particular surface structure (Ga,InP (1×2) on a {001} surface). The growth mechanism probably involves the stabilization of the surface stoichiometry by the absorbed lead population. It was found that III-V alloy layers grown by a method according to the invention have significantly lower concentrations of electron and majority traps, and consequently have better electrical properties than similar layers grown by similar methods which use no lead flux.

The lead in the growth surface is a dynamic population and the lead flux is adjusted to a value so that a particular surface population is achieved. The quantity of lead present in the grown layers is less than $5 \times 10^{17}$ atoms per cm³ and it appears to be electrically inactive. It is therefore presumed that the lead if present is in interstitial sites. The lead does not interfere with the intentional doping of the III-V alloy.

It was found that the photoluminescence efficiencies of gallium indium phosphide layers grown by a method according to the invention have been higher than the photoluminescence efficiencies of the best gallium indium phosphide layers grown by conventional molecular beam processes (those in which no lead flux was employed). When layers were grown by a method according to the invention which contained approximately $1 \times 10^{17}$ atoms Be per cm³, the layer contained $3 \times 10^{16}$ acceptors per cm³. For comparison, it was found that gallium indium phosphide grown by a conventional molecular beam process could only be doped successfully with beryllium when the beryllium content of the layer exceeded $3 \times 10^{18}$ atoms per cm³.

It was found that the lead flux had to be increased with increasing temperature, due to the increased rate at which lead escapes from the growth surface at higher temperatures. It was found when growing gallium indium phosphide using a substrate temperature of 400° C., that the lead coverage of the growth surface was $6 \times 10^{13}$ atoms/cm² (approximately 1/10 of a monolayer), this quantity of lead being provided in just over 2 seconds when using a lead flux of $2.9 \times 10^{13}$ atoms/cm² sec. After this quantity of lead has arrived at the surface, an equilibrium is reached, the lead at the growth surface being maintained at 1/10 of a monolayer, the lead which escapes from the growth surface being replaced by lead from the lead flux incident on the growth surface, both the excess lead and the escaped lead being removed from the reaction vessel by means of the pumping system connected to the reaction vessel of the epitaxy apparatus.

During the investigations which led to the invention, it was found that a lead flux produced the above-mentioned surface reconstruction and the associated improved electrical properties of the grown layer both when the group Vb element flux was in tetramic form and when this flux was in dimeric form.

An embodiment of the invention will now be described with reference to the Examples and to the drawing in which:

FIG. 1 is part of a schematic RHEED pattern from a (001) surface of an epitaxial gallium indium phosphide layer, taken in a [1 1 0] azimuth (direction), FIG. 2 is part of a schematic RHEED pattern from a reconstructed surface of an epitaxial gallium indium phosphide layer grown with a lead flux by a method according to the invention. (RHEED patterns from both the reconstructed and unreconstructed surfaces of gallium indium phosphide taken in a [110] azimuth are similar and show streaks due to the bulk lattice, thus the reconstructed surface is a Ga,InP (1×2) surface);

FIG. 3 is a schematic side sectional elevation of an apparatus used for performing a method according to the invention, and FIG. 4 is a diagrammatic longitudinal section of a molecular beam epitaxy effusion cell which is capable of generating a dimeric flux from an elemental Group V(b) source.

FIG. 1 is part of a schematic RHEED pattern of a (1 1 0) structure developed on an epitaxial gallium indium phosphide layer grown by a conventional molecular beam process (which used no lead flux). FIG. 2 shows how the FIG. 1 pattern is modified to a (1×2) reconstruction caused by the presence of lead in the growth surface. In addition to the lines corresponding to the zero order and first order reflections, which are the only lines present in the FIG. 1 pattern, additional lines a and b are present in the FIG. 2 pattern between the adjacent original pairs of lines.

It appears that bismuth and tin would produce a similar surface reconstruction of the growth surface of a III-V compound layer grown a molecular beam process as that produced by lead, but bismuth and tin have not been used during the investigations which led to the invention because these elements would not be as convenient to use in a molecular beam process as lead.

EXAMPLES

Substrates were prepared using slices cut from commercially available single crystal ingots of GaAs, the slices were 18×18×0.5 mm and the major surfaces were (001) surfaces. The slices were polished using sodium hypochlorite solution, were etched in a $H_2SO_4$:$H_2O_2$:$H_2O$ etchant consisting of 7 volumes of 98% by weight sulphuric acid, 1 volume of 50 volume hydrogen peroxide solution and 1 volume of water. The slices were further etched in 2% V/V bromine in methanol. A substrate 1 consisting of one of the etched GaAs slices was then mounted on a molybdenum heating block 2, a thin layer of indium (not shown in the drawing) being disposed between the substrate 1 and the heating block 2 so as to improve the thermal contact between the substrate 1 and the heating block 2. The heating block 2 was then inserted into a vacuum chamber 3 of the apparatus shown in the drawing of FIG. 3. Pressure in the vacuum chamber 3 was then reduced to $10^{-7}$ Torr, the substrate 1 was heated to 500° C. for 10 minutes, and the vacuum chamber 3 was then baked at 180° C. for 14 hours, after which time pressure in the vacuum chamber 3 had been reduced to $2\times10^{-10}$ Torr.

The apparatus contained effusion cells 4 and 5 containing gallium and arsenic respectively. The cell 5 was a molecular beam epitaxy effusion cell of the construction shown in FIG. 4 which is capable of producing an $As_2$ flux from elemental arsenic.

Referring to FIG. 4, the molecular beam epitaxy effusion cell 5 comprises an alumina tube 6 which has outside and inside diameters of 19 and 13 mm respectively and is 100 mm long, and which has a 20 mm wide central portion 7 having a reduced outside diameter of 16 mm. The thick portions 8,9 of the tube 6 constitute first and second heating zones respectively, and are provided with a plurality of bores 10,11 respectively, through which respective heating elements 12,13 extend. Power leads 14 and 15 extend respectively from the heating elements 12 and 13. A crucible 16 in the form of a conventional graphite Knudsen effusion cell having a capacity of 2 ml is disposed within the first heating zone. A thermocouple 17 is provided in the base of the crucible 16 and an apertured graphite disc 18 is disposed at the open end of the crucible 16. A dissociation cell 19 is disposed in the second heating zone. The cell 19 comprises a graphite tube 20 with a centrally bored end member 21 at the end opposed to the crucible 16. A graphite heat exchanger 22 abuts the end member 17 and a graphite cylinder 23 having an orifice 24 which extends obliquely to the longitudinal axis of the tube 20 fits in the end of the tube 20 which is remote from the crucible 16. A tantalum tube 25 spaces the cylinder 23 from the heat exchanger 22. Heat-shielding means 26 comprising apertured tantalum discs 27 mutually separated by alumina rings 28 are disposed within the central portion 7 of the alumina tube 6 between the crucible 16 and the dissociation cell 19, a tantalum spring 29 holding the end tantalum disc 27a in position. The second heating zone is surrounded by three concentric tantalum cylindrical heat shields 30, 31, 32 and two heat shields 33, 34 are disposed at the front end of the effusion cell 5. The effusion cell 5 is mounted in a water-cooled holder 35.

Referring to FIG. 3, the effusion cells are mounted in the vacuum chamber 3 within a shroud 36 cooled by liquid nitrogen. A shutter 37 is adapted to move across the aperture 38 of the shroud 36. The apparatus includes an electron gun 39 used to monitor both the substrate cleaning and to determine the surface structure present during growth of an epitaxial layer 40 on the substrate 1, diffracted electrons being incident on a RHEED screen 41. Pressure is reduced in the vacuum chamber by means of a pump 42 connected to the vacuum chamber 3 through a tube 43.

The cells 4 and 5 are heated to the required temperatures so as to produce fluxes of $2\times10^{14}$ and $10^{15}$ mols/cm²/sec respectively. In order to produce an $As_2$ flux, arsenic in the cell 5 is first heated to 350° C., and the $As_4$ flux generated passed into the second heating zone where it is dissociated to form an $As_2$ flux by maintaining the graphite heat exchanger 22 (FIG. 4) at a temperature of 1100° C. The substrate 1 is heated at 590° C. and is exposed to a flux of $As_2$ of $10^{14}$ mols/cm²/sec for 20 minutes. The temperature of the substrate 2 is then reduced to the growth temperature and the gallium cell is unshuttered. A 0.3 μm thick layer 40 of undoped GaAs is grown at a rate of 0.3 μm per hour, the temperatures of the substrate 1 and the effusion cells 4 and 5 being kept constant during the growth process.

The vacuum chamber 3 also contained effusion cells 44, 45, 46 and 47 for beryllium, lead, indium and phosphorus respectively. The phosphorus effusion cell 47 is similar to the arsenic effusion cell 5, being capable of producing a $P_2$ flux from red phosphorus.

After deposition of the gallium arsenide layer 40 has been completed, the heating block 2 is turned away from the effusion cells until the growth conditions suitable for growing a desired beryllium-doped $Ga_xIn_{1-x}P$ alloy (x≈0.5) has been established.

A power input of 5 watts is supplied to the heating element of the first heating zone of the phosphorus effusion cell 47 and 60 watts is supplied to the heating element of the second heating element of the effusion cell 47. The temperature in this second heating zone is thereby raised to 1050° C. which produced a $P_2$ flux of $3\times10^{15}$ atoms per cm² per sec., and the pressure in the vacuum chamber 3 is increased to $3\times10^{-6}$ Torr due to the release of the $P_2$ flux into the vacuum chamber 3. The gallium, beryllium, lead and indium effusion cells (4, 44, 45 and 46 respectively) are heated to the operating temperatures required (1100, 777, 965 and 1007° C. respectively) so as to produce fluxes of $1.5\times10^{14}$, $2.9\times10^9$, $3\times10^{13}$ and $1.5\times10^{14}$ atoms/cm²/sec. respectively, and are stabilized. The temperature of the heating block 2 is raised to and maintained at 400° C., and the heating block 2 is turned so that the gallium arsenide layer 40 faces the effusion cells and exhibited a (2×4) reconstruction. The gallium, beryllium, lead and indium effusion cells are then simultaneously unshuttered. Throughout the duration of the growth, the temperatures of the effusion cells and of the substrate holder 2 are kept constant. The surface structures of first the GaAs layer 40 and subsequently of the $Ga_{0.5}In_{0.5}P$ layer 48 are observed on the RHEED screen 41, by means of electrons diffracted at the growth surface and which are directed at the growth surface from the electron gun 39.

It is important to observe a (1×2) RHEED pattern from the surface of the $Ga_{0.5}In_{0.5}P$ layer 48 during growth. This pattern appeared about two seconds after the lead cell 45 had been unshuttered and persisted for the remainder of the growth period.

Growth is continued for 2 hours until the $Ga_{0.5}In_{0.5}P$ layer 48 has reached a thickness of 1 μm. Using a substrate temperature of 400° C., the gallium indium phosphide can be doped with beryllium in a concentration of $2 \times 10^{17}$ atoms/cm$^3$ to provide a free hole concentration of $4 \times 10^{16}$/cm$^3$. The carrier concentration is determined with a capacitance/voltage profile and the type of carrier is verified by the sign of the surface photovoltage. This result indicates that the concentration of hole traps has been reduced by a factor of 20 compared with growth in the absence of lead.

The following Table gives particulars of the temperature $T_B$ of the beryllium effusion cell, P the free hole concentration in the grown $Ga_{0.5}In_{0.5}P$ layer and [Be], the beryllium concentration of the grown layer, for layers grown by methods similar to that described above.

TABLE

| Example | $T_B$ (°C.) | P holes/cm$^3$ | [Be] (atoms/cm$^3$) |
| --- | --- | --- | --- |
| 1 | 777 | $4 \times 10^{16}$ | $2 \times 10^{17}$ |
| 2 | 794 | $1.4 \times 10^{16}$ | $3.7 \times 10^{17}$ |
| 3 | 800 | $1.5 \times 10^{17}$ | $5.6 \times 10^{17}$ |
| 4 | 830 | $2.9 \times 10^{17}$ | $1.3 \times 10^{18}$ |

I claim:
1. A method of forming an epitaxial layer of a doped at least ternary III–V alloy on a semiconductor substrate, the method comprising the steps of placing the semiconductor substrate in a vacuum chamber, reducing the pressure in the vacuum chamber to below atmospheric pressure, maintaining the semiconductor substrate at a temperature in the range from 300° C. to 500° C., and forming the epitaxial layer by directing a plurality of molecular beams containing the constituent elements of the doped material constituting the epitaxial layer and by directing a molecular beam of lead all onto the heated substrate for a time sufficient to grow an epitaxial layer of a desired thickness, said molecular beam of lead forming from 5 to 20% of a monolayer of lead on the growth surface.

2. A method as claimed in claim 1, wherein the doped III–V alloy is beryllium-doped gallium indium phosphide.

3. A method as claimed in one of claims 1 or 2, wherein said lead is present in grown layers at less than $5 \times 10^{17}$ atoms per cm$^3$.

4. A method as claimed in claim 1, wherein lead is maintained at the growth surface in approximately 1/10 of a monolayer.

* * * * *